United States Patent
Chen et al.

(10) Patent No.: US 8,100,082 B2
(45) Date of Patent: Jan. 24, 2012

(54) METHOD AND SYSTEM FOR INTRODUCING PROCESS FLUID THROUGH A CHAMBER COMPONENT

(75) Inventors: Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 685 days.

(21) Appl. No.: 11/750,539

(22) Filed: May 18, 2007

(65) Prior Publication Data

US 2008/0282979 A1 Nov. 20, 2008

(51) Int. Cl.
*C23C 16/30* (2006.01)
*C23F 1/00* (2006.01)
*H01L 21/306* (2006.01)

(52) U.S. Cl. .................... 118/723 MW; 156/345.41
(58) Field of Classification Search .......... 118/723 MW; 156/345.41

See application file for complete search history.

(56) References Cited

U.S. PATENT DOCUMENTS

| | | | | |
|---|---|---|---|---|
| 5,024,716 A * | 6/1991 | Sato | ............................ | 156/345.42 |
| 5,038,712 A * | 8/1991 | Fujiyama | ............... | 118/723 MW |
| 5,746,875 A * | 5/1998 | Maydan et al. | ........... | 156/345.34 |
| 6,783,628 B2 * | 8/2004 | Yamamoto et al. | ....... | 156/345.41 |
| 6,823,816 B2 * | 11/2004 | Ishii et al. | .............. | 118/723 MW |
| 6,942,767 B1 * | 9/2005 | Fazzina et al. | ................. | 204/252 |
| 2003/0037880 A1 * | 2/2003 | Carducci et al. | .......... | 156/345.43 |
| 2004/0261712 A1 * | 12/2004 | Hayashi et al. | ............ | 118/723 E |
| 2005/0109279 A1 * | 5/2005 | Suzuki | .................. | 118/723 MW |
| 2005/0109460 A1 * | 5/2005 | DeDontney et al. | ...... | 156/345.33 |

\* cited by examiner

Primary Examiner — Keath Chen

(57) ABSTRACT

A method and system for introducing a process fluid through a chamber component in a processing system is described. The chamber component comprises a chamber element having a first surface on a supply side of the chamber element and a second surface on a process side of the chamber element, wherein the process side is opposite the supply side. Furthermore, the chamber component comprises a conduit extending through the chamber element from the supply side to the process side, wherein the conduit comprises an inlet configured to receive a process fluid and an outlet configured to distribute the process fluid.

17 Claims, 14 Drawing Sheets

METHOD AND SYSTEM FOR INTRODUCING PROCESS FLUID THROUGH A CHAMBER COMPONENT

BACKGROUND OF THE INVENTION

1. Field of the Invention

The present invention relates to a method and system for introducing process fluid through a chamber component, and more particularly to a method and system for introducing process fluid through a chamber component in a processing system.

2. Description of Related Art

The fabrication of integrated circuits (IC) in the semiconductor industry typically employs plasma to create and assist surface chemistry within a processing chamber necessary to remove material from and deposit material on a substrate. In general, plasma is formed within the processing chamber under vacuum conditions by heating electrons in the presence of an electric field to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate). In semiconductor manufacturing, numerous techniques exist for creating plasma including, but not limited to, capacitively coupled plasma (CCP) systems, inductively coupled plasma (ICP) systems, electron cyclotron resonance (ECR) plasma systems, helicon wave plasma systems, surface wave plasma systems, slotted plane antenna (SPA) plasma systems, etc. Plasma is formed from the interaction of the supplied process gas with electro-magnetic (EM) field propagation at frequencies in the radio frequency (RF) or microwave spectrum. Common to all of these systems, dielectric members are utilized through which or within which an electric field may be present. Furthermore, it is desirable to introduce process gas through these dielectric members while avoiding electric break-down or discharge within these dielectric members.

SUMMARY OF THE INVENTION

The present invention relates to a method and system for introducing process fluid through a chamber component. Additionally, a method and system is provided for introducing process fluid through a chamber component in a plasma processing system.

Furthermore, a method and system is provided for introducing process fluid through a dielectric member. Further yet, a method and system is provided for introducing process fluid through a dielectric member in the presence of an electric field.

According to one embodiment, a method and system for introducing a process fluid through a chamber component in a processing r system is described. The chamber component comprises a chamber element having a first surface on a supply side of the chamber element and a second surface on a process side of the chamber element, wherein the process side is opposite the supply side. Furthermore, the chamber component comprises a helical conduit extending through the chamber element from the supply side to the process side, wherein the helical conduit comprises an inlet configured to receive a process fluid and an outlet configured to distribute the process fluid.

According to another embodiment, a method of fabricating a conduit through a chamber element is described, comprising: forming an opening through the chamber element extending from a supply side on the chamber element to a process side on the chamber element, the opening having an inner surface; forming an insert element having an outer surface configured to mate with the inner surface of the opening; forming one or more grooves in the outer surface of the insert element such that each of the one or more grooves comprises an inlet formed at the supply side and an outlet formed at the process side; and inserting the insert element into the opening of the chamber element.

According to another embodiment, a treatment system is described, comprising: a process chamber, including a process space; a process gas supply system in fluid communication with the process chamber and configured to introduce a flow of a process gas to the process chamber; a gas distribution system coupled to the process chamber and configured to receive the flow of the process gas through an inlet and distribute the flow of the process gas in the process space, wherein the gas distribution system comprises a gas injection device coupled to the inlet and wherein the gas injection device comprises a helical conduit extending from an inlet end to an outlet end; a holder coupled to the process chamber and configured to support a substrate in the process chamber for exposure to the process gas; and a vacuum pumping system coupled to the process chamber and configured to evacuate the process chamber.

DETAILED DESCRIPTION OF SEVERAL EMBODIMENTS

In the following description, purposes of explanation and not limitation, specific details are set forth, such as a particular geometry of the vacuum or plasma processing system and descriptions of various components. However, it should be understood that the invention may be practiced in other embodiments that depart from these specific details.

In material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

According to one example, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative resist) using a developing solvent.

Figure 1A:
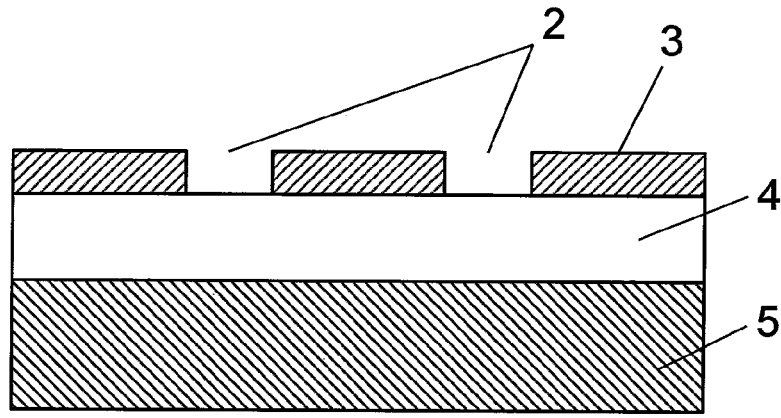
FIGS. 1A through 1C illustrate a schematic representation of a procedure for pattern etching a thin film.
Figure 1B:
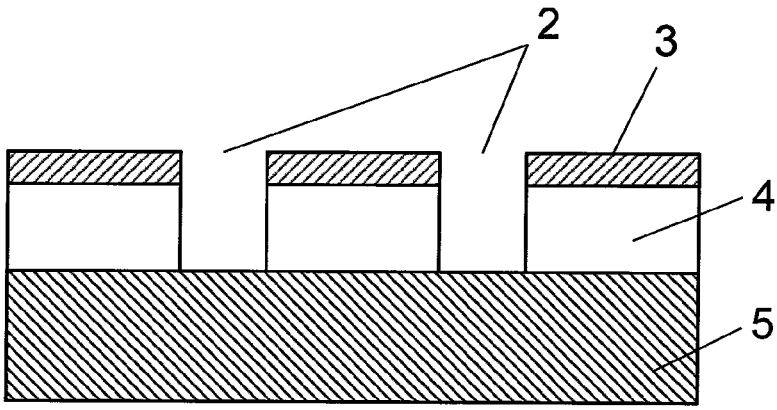
Figure 1C:
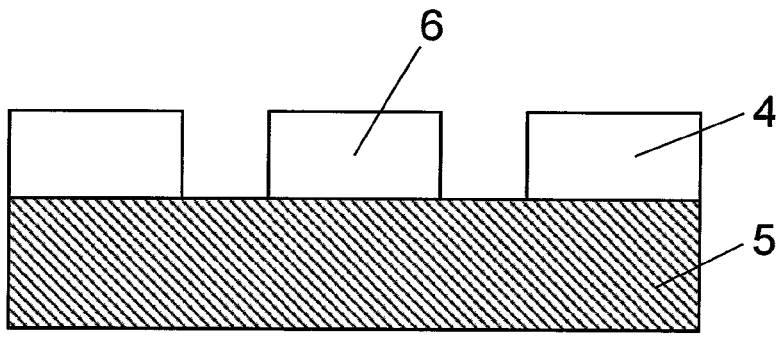

Referring still to this example, as shown in FIGS. 1A through 1C, a mask comprising light-sensitive layer 3 with pattern 2 (such as patterned photoresist) can be utilized for transferring feature patterns into a material such as thin film 4, for example, a layer of polycrystalline silicon (polysilicon), on a substrate 5. The pattern 2 is transferred to the thin film 4 using, for instance, plasma assisted etching, in order to form feature 6, such as a gate structure, and upon completion of etching, the mask 3 is removed.

Conventionally, plasma assisted etching processes involve the use of corrosive process gases, such as halogen containing gases (e.g., HF, HCl, HBr, $Cl_2$, $NF_3$, $C_xF_y$, $C_xF_yH$, etc.). Moreover, the use of such gases in the presence of plasma leads to highly aggressive chemical species which, in turn, may attack and erode chamber surfaces. Therefore, plasma processing systems are often protected with thick chamber members that are erosion resistant, or when eroded offer chemical species that are not detrimental to the processes occurring on the substrate. Furthermore, during the formation of plasma, it is necessary to couple EM power through chamber members and, therefore, some chamber members may comprise a dielectric material.

Figure 2:
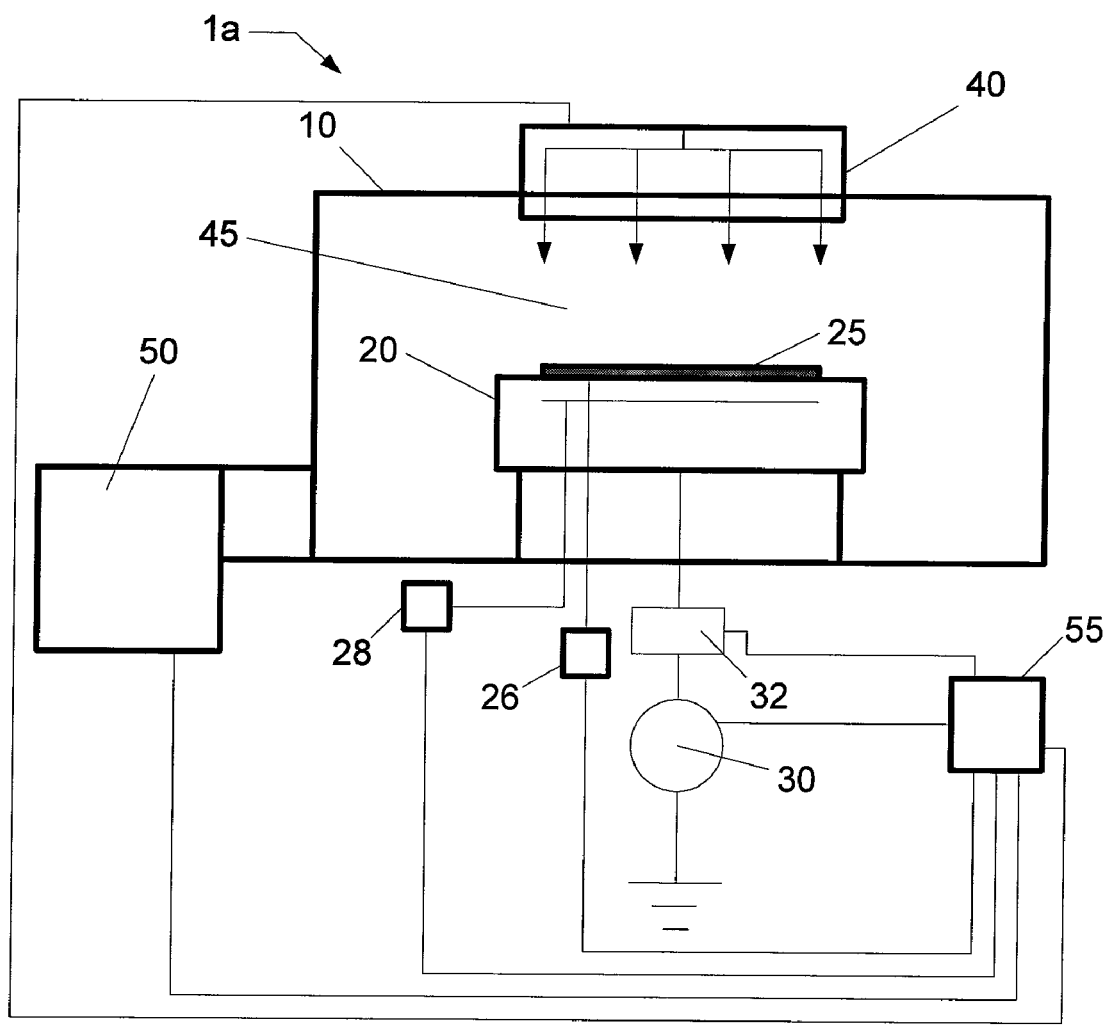
FIG. 2 shows a schematic representation of a plasma processing system according to an embodiment.

According to one embodiment, a plasma processing system 1a is depicted in FIG. 2 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40 that is configured to reduce or minimize the introduction of contaminants to substrate 25. For a given flow of process gas, the process pressure is adjusted using the vacuum pumping system 50. Plasma can be utilized to create materials specific to a predetermined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 2, substrate holder 20 can comprise an electrode through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Vacuum pump system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pump system 50, as well as the substrate heating/cooling system (not shown), the backside gas supply system 26, and/or the clamping system 28. For example, a program stored in the memory can be utilized to activate the inputs to the aforementioned components of plasma processing system 1a according to a process recipe in order to perform a plasma assisted process on substrate 25. One example of controller 55 is a DELL PRECISION WORKSTATION 610™, available from Dell Corporation, Austin, Tex.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 3, the plasma processing system 1b can be similar to the embodiment of FIG. 2 and further comprise either a stationary, or mechanically or electrically rotating magnetic field system 60, in order to potentially increase plasma density and/or improve plasma processing uniformity, in addition to those components described with reference to FIG. 2. Moreover, controller 55 can be coupled to magnetic field system 60 in order to regulate the speed of rotation and field strength. The design and implementation of a rotating magnetic field is well known to those skilled in the art.

Figure 3:
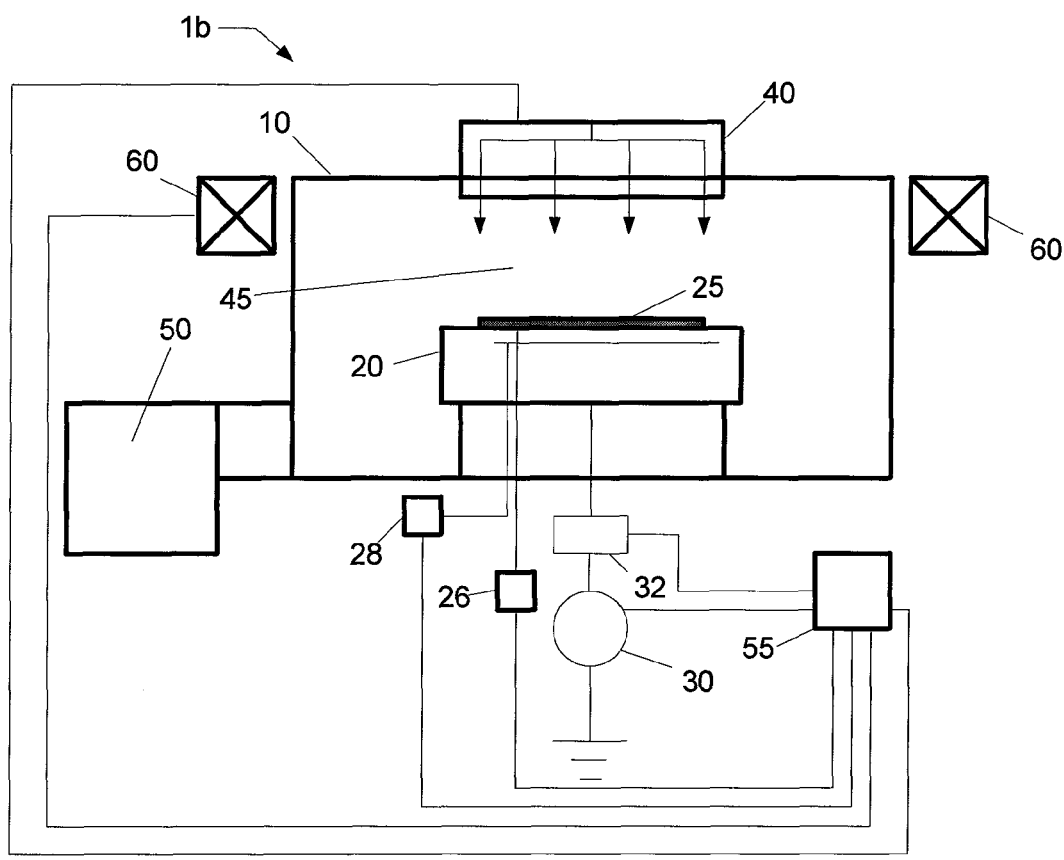
FIG. 3 shows a schematic representation of a plasma processing system according to another embodiment.
Figure 4:
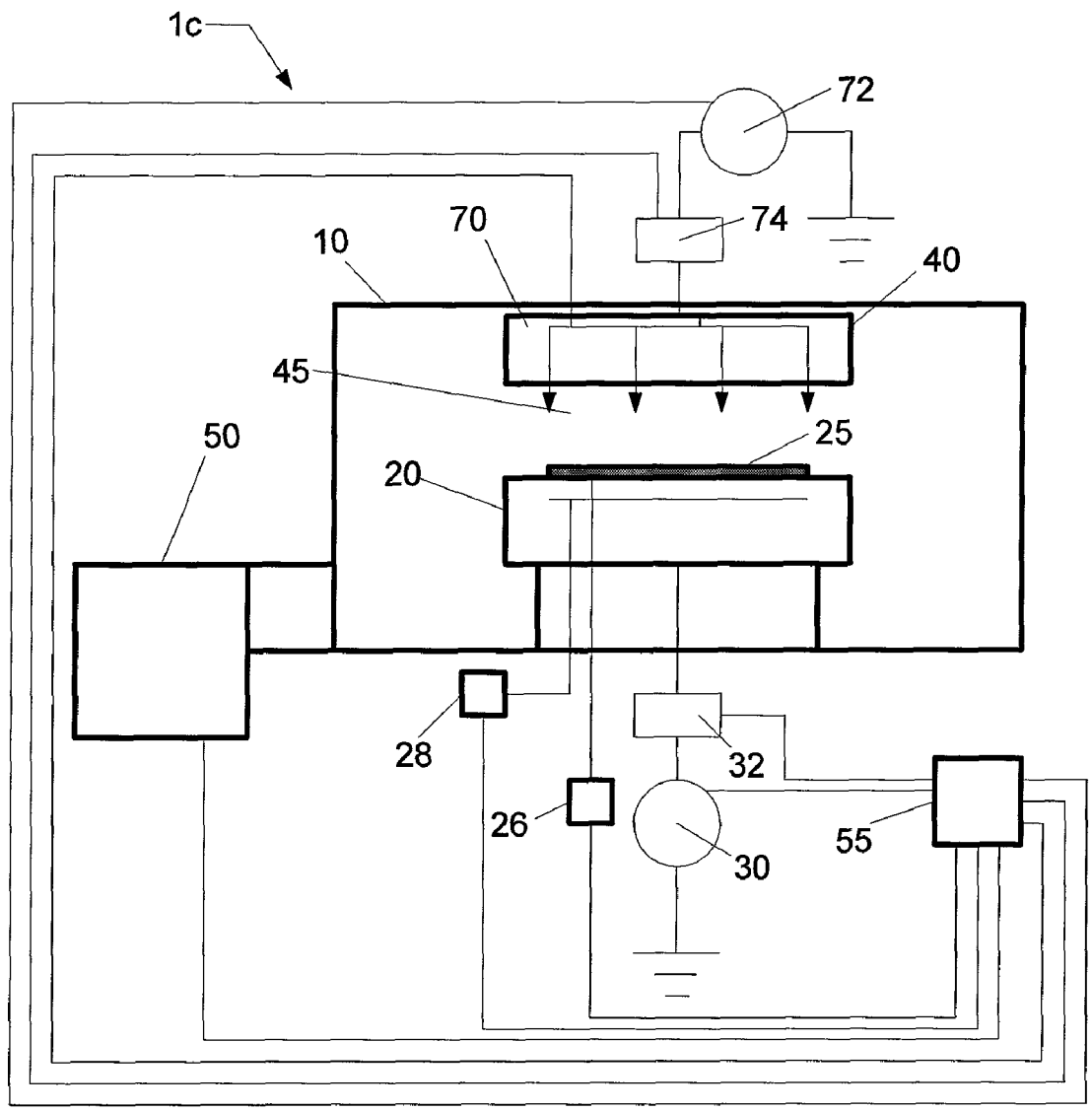
FIG. 4 shows a schematic representation of a plasma processing system according to another embodiment.

In the embodiment shown in FIG. 4, the plasma processing system 1c can be similar to the embodiment of FIG. 2 or FIG. 3, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 5:
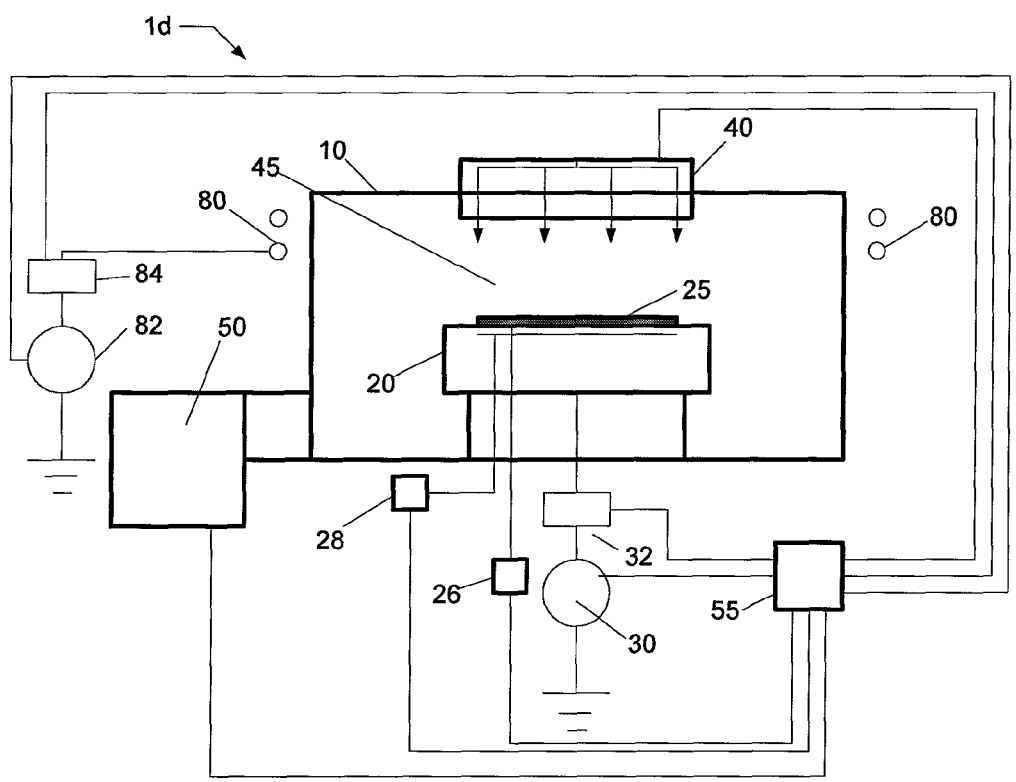
FIG. 5 shows a schematic representation of a plasma processing system according to another embodiment.

In the embodiment shown in FIG. 5, the plasma processing system 1d can be similar to the embodiments of FIGS. 2 and 3, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80.

Figure 6:
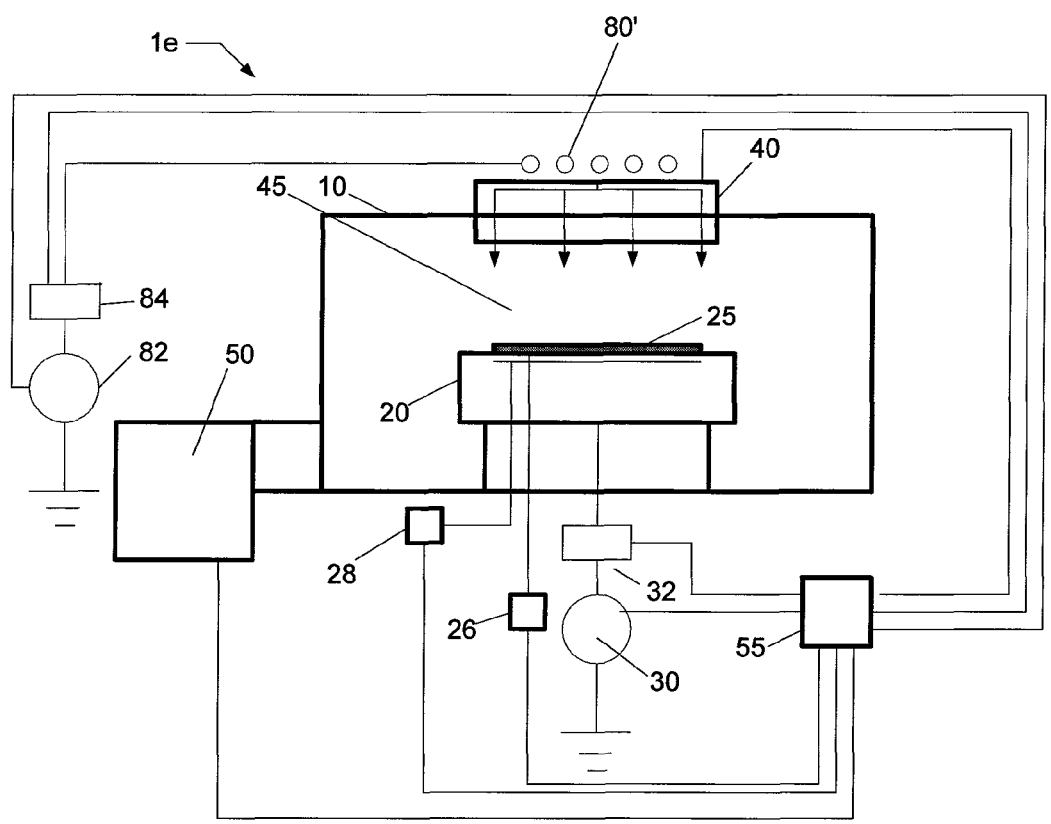
FIG. 6 shows a schematic representation of a plasma processing system according to another embodiment.

In an alternate embodiment, as shown in FIG. 6, the plasma processing system 1e can be similar to the embodiment of FIG. 5, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7:
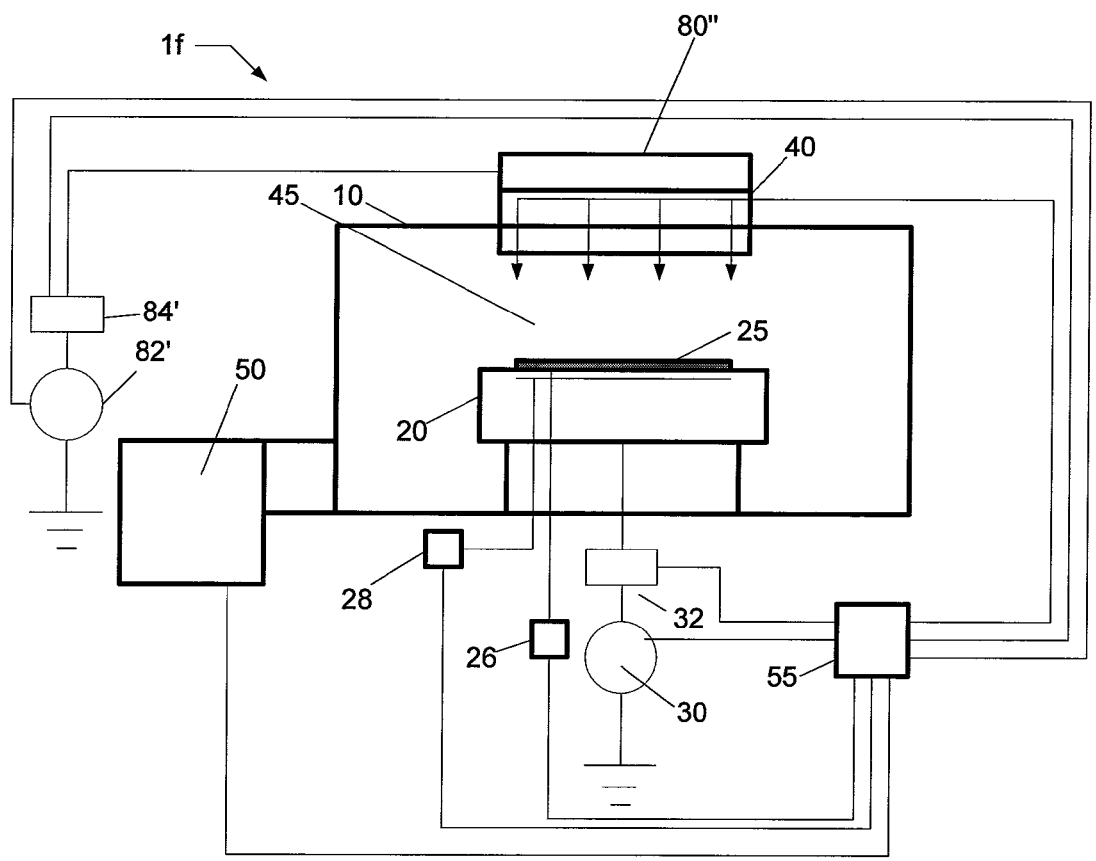
FIG. 7 shows a schematic representation of a plasma processing system according to another embodiment.

In the embodiment shown in FIG. 7, the plasma processing system 1f can be similar to the embodiments of FIGS. 2 and 3, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a gas distribution system for introducing a process gas to a processing system through a gas injection device formed in a chamber element is presented. The gas distribution system may, for example, be utilized (as illustrated by label 40) in any one of the plasma processing systems described in FIGS. 2 through 7, or a plasma processing system with any combination of features from the systems of FIGS. 2 through 5. Furthermore, the gas distribution system may, for example, be utilized in any substrate processing system that requires introduction of a process gas through a chamber element.

Figure 8A:
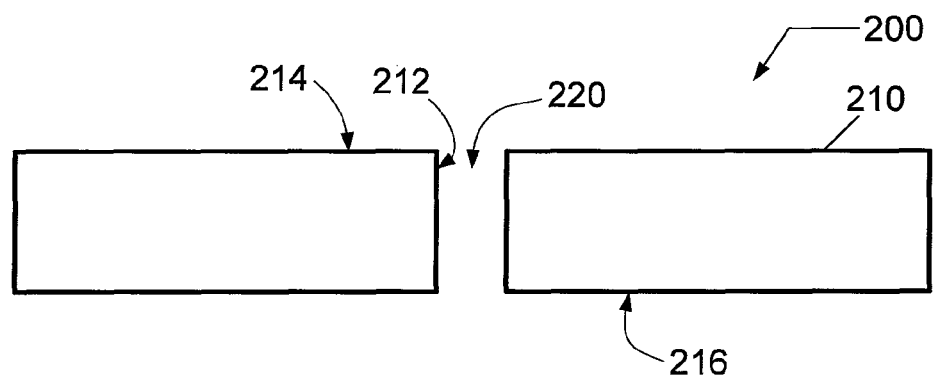
FIGS. 8A, 8B and 8C illustrate a gas distribution opening and a method of fabricating the opening according to an embodiment.
Figure 8B:
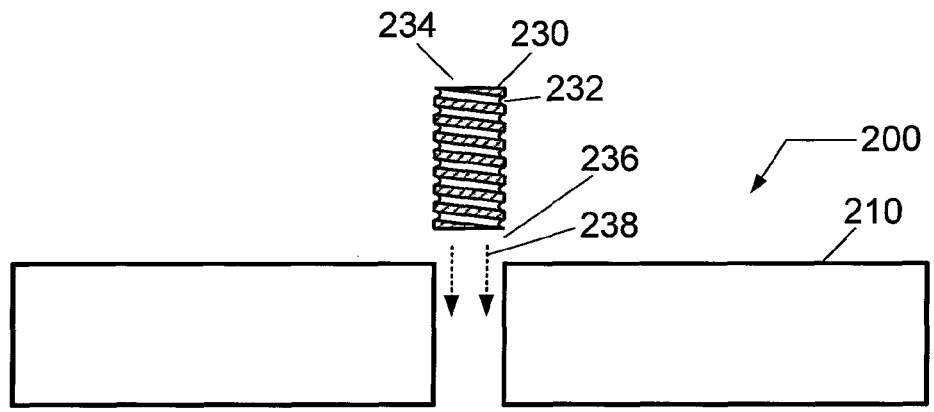
Figure 8C:
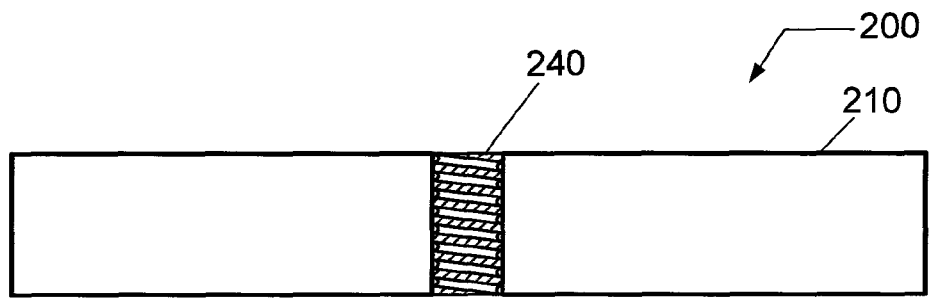

Referring now to FIGS. 8A, 8B and 8C, a fluid distribution system 200 and a method of fabricating fluid distribution system 200 are presented according to one embodiment. Fluid distribution system 200 is configured to be coupled to a processing chamber and to receive a flow of a process fluid from a process fluid supply system and distribute the flow of the process fluid within the processing chamber. For example, the process fluid can comprise a gas, a liquid, or a multi-phase fluid including solid material suspended in a liquid (e.g., a slurry), solid material suspended in a gas, or gaseous material suspended in a liquid. Alternatively, for example, the process fluid can include a solid powder.

Fluid distribution system 200 comprises a chamber element 210 comprising a first surface on a supply side of the chamber element 210 and a second surface on a process side of the chamber element 210, wherein the process side is opposite the supply side. The chamber element 210 comprises an opening 220 having an interior surface 212 that is formed through the chamber element 210 from the supply side to the process side. As shown in FIGS. 8A through 8C, the interior surface 212 is a non-tapered surface of finite length formed about a longitudinal axis of opening 220. The non-tapered surface is characterized by a continuous slope between distal ends of interior surface 212 in a direction parallel with the longitudinal axis of opening 220. For example, the interior surface 212 is a non-tapered, cylindrical surface. Additionally, for example, the interior surface 212 is a non-tapered, circular cylindrical surface, i.e., interior surface 212 is a cylindrical surface having a circular cross-section characterized by a constant radius along the longitudinal axis. Additionally yet, for example, the interior surface 212 is a non-tapered, right circular cylindrical surface, i.e., interior surface 212 has circular distal ends. Opening 220 may be formed using any conventional machining procedure. Chamber element 210 can be fabricated from a conductive material, a non-conductive material, or a semi-conductive material. For example, chamber element 210 can be fabricated from a metal or metal alloy, such as aluminum or aluminum alloy. Additionally, the chamber element 210 may include a protective coating formed on a surface thereof. For example, the coating may include a ceramic coating or surface anodization. Chamber element 210 may be fabricated from quartz, silicon, single crystal silicon, polycrystalline silicon, silicon nitride, silicon carbide, carbon, glassy carbon, alumina, sapphire, aluminum nitride, etc.

Additionally, fluid distribution system 200 comprises an insert element 230 configured to be inserted within opening 220. The insert element 230 comprises a groove 232 formed in an outer surface of the insert element 230 that extends in a helical path from an inlet end 234 of insert element 230 on a first side of chamber element 210 to an outlet end 236 of insert element 230 on a second side of chamber element 210. The groove 232 can be scored in the outer surface of the insert element 230 using a lathe and cutting tip, or it may be scored using a rotating cutting tip. The insert element 230 can be fabricated from the same material as the chamber element 210, or the insert element 230 can be fabricated from a different material than the chamber element 210.

Once groove 232 is formed on the outside surface of insert element 230, the insert element 230 is inserted into the opening 220 of chamber element 210 in order to form gas injection device 240 having a helical conduit extending from the supply side of the chamber element 210 to the process side of the chamber element 210 as illustrated by reference numeral 238 in FIG. 8B. The insert element 230 may be captured by the chamber element 210 by fusing the insert element 230 within opening 220 of chamber element 210, press fitting the insert element 210 into opening 220 of chamber element 210, thermally fitting the insert element 210 into opening 220 of chamber element 210, welding the insert element 230 within opening 220 of chamber element 210, brazing the insert element 230 within opening 220 of chamber element 210, or mechanically clamping the insert element 230 within opening 220 of chamber element 210, or a combination of two or more thereof.

For example, the chamber element 210 and the insert element 230 may be fabricated from quartz, and a bonding agent can include quartz frit. To manufacture the quartz frit, a dopant is placed in ground quartz to lower its melting temperature. Thereafter, the quartz frit may be suspended within a solvent, such as acetone, and applied to the bonding surfaces of the chamber element 210 and the insert element 230 using spray coating equipment and masking techniques. Once the frit coating is applied to the bonding surfaces, the chamber element 210 and the insert element 230 are joined together under mechanical pressure in a kiln and fired at a temperature sufficient to melt the frit. Quartz fusing processes are known to those of ordinary skill in the art of quartz processing.

In this exemplary embodiment, the cross-section of the insert element 230 is shown to be circular or substantially circular. However, the cross-section can take on any arbitrary shape. For example, the cross-section can be ovular, triangular, square, rectangular, or any multi-sided shape. Also, in this exemplary embodiment, the helical path of groove 232 is shown to make at least one turn about an axis extending from the supply side to the process side (360 degrees revolution along the outside surface of the insert element 230) and, in this case, multiple turns. However, the helical path of groove 232 may take substantially one turn, or more than one turn (e.g., multiple turns), or less than one turn (less than 360 degrees revolution). For example, less than one turn can include a path extending along one side or a portion of one side on a multi-sided cross-section. Alternatively, the path of groove 232 may be straight.

Furthermore, the chamber element 210 or the insert element 230 or both can comprise an alignment feature configured to mate with a respective feature on either the chamber element 210 or the insert element 230 in order to ensure precise alignment of the insert element 230 within chamber element 210.

Although one groove 232 is illustrated in FIGS. 8A through 8C, a plurality of grooves may be formed in the outer surface of the insert element 230, each groove being independent of one another. Additionally, each groove in a plurality of grooves can be constructed to have a different outlet angle at the outlet end 236 of the insert member 230. Furthermore, each groove in a plurality of grooves can be constructed to have a different size, diameter or cross-sectional lateral dimension at the outlet end 236 or the inlet end 234 or at any location along the length of the helical path of the insert member 230. Further yet, each groove in a plurality of grooves can be constructed to have a different lateral dimension for the helix.

The diameter or cross-sectional lateral dimension of the groove 232 can range from approximately 5 microns to approximately 5 mm. Alternatively, the diameter or lateral dimension of the groove 232 can range from approximately 10 microns to approximately 3 mm. Alternatively yet, the diameter or lateral dimension of the groove 232 can range from approximately 50 microns to approximately 2 mm. For example, the diameter or lateral dimension can be approximately 50 microns or approximately 1 mm or approximately 2 mm.

According to another embodiment, insert element 230 may be formed within another insert element (which may be formed within another insert element, etc.). Insert element 230 may or may not be concentric with the other insert element. The other insert element, within which insert element 230 is formed, may also include one or more helical grooves formed on an outer surface thereof.

Figure 9A:
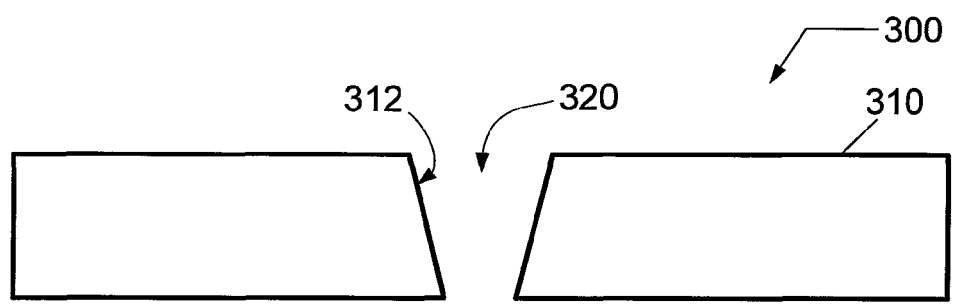
FIGS. 9A, 9B and 9C illustrate a gas distribution opening and a method of fabricating the opening according to another embodiment.
Figure 9B:
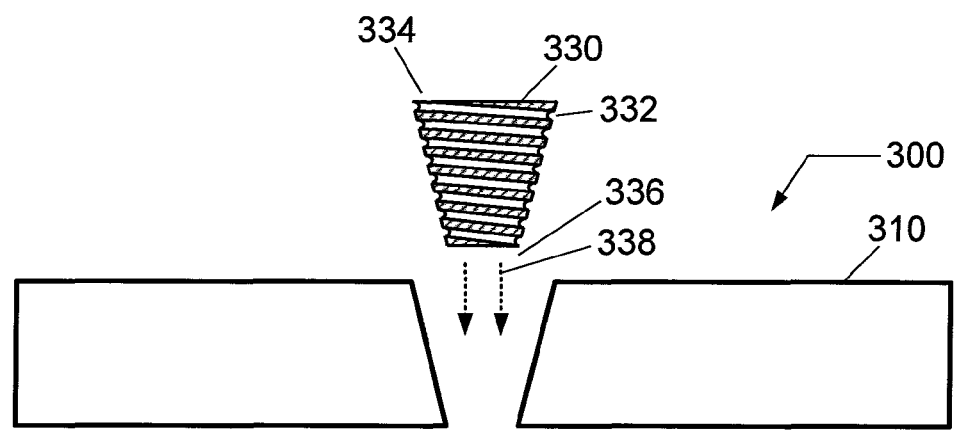
Figure 9C:
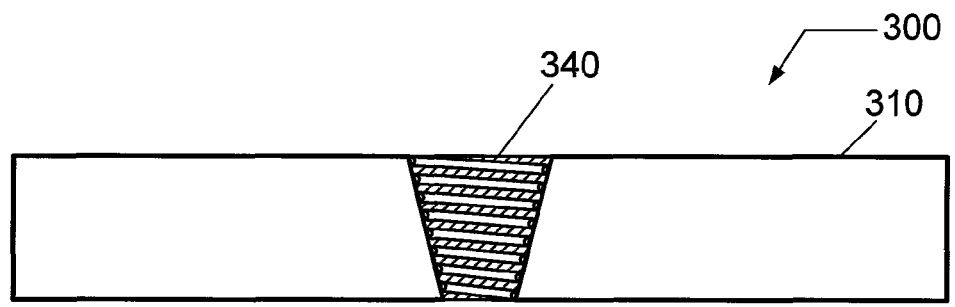

Referring now to FIGS. 9A, 9B and 9C, a fluid distribution system 300 and a method of fabricating fluid distribution system 300 are presented according to another embodiment. Fluid distribution system 300 is configured to be coupled to a processing chamber and to receive a flow of a process fluid from a process fluid supply system and distribute the flow of the process fluid within the processing chamber. For example, the process fluid can comprise a gas, a liquid, or a multi-phase fluid including solid material suspended in a liquid (e.g., a slurry), solid material suspended in a gas, or gaseous material suspended in a liquid. Alternatively, for example, the process fluid can include a solid powder.

Fluid distribution system 300 comprises a chamber element 310 comprising a first surface on a supply side of the chamber element 310 and a second surface on a process side of the chamber element 310, wherein the process side is opposite the supply side. The chamber element 310 comprises an opening 320 having a shaped interior surface 312 that is formed through the chamber element 310 from the supply side to the process side. For example, the shaped interior surface 312 can comprise a tapered interior surface. As shown in FIGS. 9A through 9C, the interior surface 312 is a tapered surface of finite length formed about a longitudinal axis of opening 320. The tapered surface is characterized by a continuous slope between distal ends of interior surface 312 in a direction parallel with the longitudinal axis of opening 320. For example, the interior surface 312 is a tapered, cylindrical surface. Additionally, for example, the interior surface 312 is a tapered, circular cylindrical surface, i.e., interior surface 12 is a cylindrical surface having a circular cross-section characterized by a linearly varying radius along the longitudinal axis. Additionally yet, for example, the interior surface 312 is a tapered, right circular cylindrical surface, i.e., interior surface 312 has circular distal ends. Alternatively, the shaped interior surface 312 can comprise a stepped surface, a concave surface, or a convex surface, or combination thereof. Opening 320 may be formed using any conventional machining procedure. Chamber element 310 can be fabricated from a conductive material, a non-conductive material, or a semi-conductive material. For example, chamber element 310 can be fabricated from a metal or metal alloy, such as aluminum or aluminum alloy. Additionally, the chamber element 310 may include a protective coating formed on a surface thereof. For example, the coating may include a ceramic coating or surface anodization. Chamber element 310 may be fabricated from quartz, silicon, single crystal silicon, polycrystalline silicon, silicon nitride, silicon carbide, carbon, glassy carbon, alumina, sapphire, aluminum nitride, etc.

Additionally, fluid distribution system 300 comprises a shaped insert element 330 configured to be inserted within opening 320. The shape of the outer surface of the shaped insert element 330 can be designed to mate with the shape of the shaped interior surface 312 of opening 320. The shaped insert element 330 comprises a groove 332 formed in an outer surface of the shaped insert element 330 that extends in a helical path from an inlet end 334 of shaped insert element 330 on a first side of chamber element 310 to an outlet end 336 of shaped insert element 330 on a second side of chamber element 310. The groove 332 can be scored in the outer surface of the shaped insert element 330 using a lathe and cutting tip, or it may be scored using a rotating cutting tip. The shaped insert element 330 can be fabricated from the same material as the chamber element 310, or the shaped insert element 330 can be fabricated from a different material than the chamber element 310.

Once groove 332 is formed on the outside surface of shaped insert element 330, the shaped insert element 330 is inserted into the opening 320 of chamber element 310 in order to form gas injection device 340 having a helical conduit extending from the supply side of the chamber element 210 to the process side of the chamber element 310 as illustrated by reference numeral 338 in FIG. 9B. The shaped insert element 330 may be captured by the chamber element 310 by orienting chamber element 310 such that interior surface 312 of opening 320 supports shaped insert element 330. For instance, shaped insert element 330 may rest within opening 320 of chamber element 310. Alternatively, the shaped insert element 330 may be captured by fusing the shaped insert element 330 within opening 320 of chamber element 310, welding the shaped insert element 330 within opening 320 of chamber element 310, brazing the shaped insert element 330 within opening 320 of chamber element 310, or mechanically clamping the shaped insert element 330 within opening 320 of chamber element 310, or a combination of two or more thereof.

For example, the chamber element 310 and the shaped insert element 330 may be fabricated from quartz, and a bonding agent can include quartz frit. To manufacture the quartz frit, a dopant is placed in ground quartz to lower its melting temperature. Thereafter, the quartz frit may be suspended within a solvent, such as acetone, and applied to the bonding surfaces of the chamber element 310 and the shaped insert element 330 using spray coating equipment and masking techniques. Once the frit coating is applied to the bonding surfaces, the chamber element 310 and the shaped insert element 330 are joined together under mechanical pressure in a kiln and fired at a temperature sufficient to melt the frit. Quartz fusing processes are known to those of ordinary skill in the art of quartz processing.

In this exemplary embodiment, the cross-section of the shaped insert element 330 is shown to be circular or substantially circular. However, the cross-section can take on any arbitrary shape. For example, the cross-section can be ovular, triangular, square, rectangular, or any multi-sided shape. Also, in this exemplary embodiment, the helical path of groove 332 is shown to make at least one turn about an axis extending from the supply side to the process side (360 degrees revolution along the outside surface of the shaped insert element 330) and, in this case, multiple turns. However, the helical path of groove 332 may take substantially one turn, or more than one turn (e.g., multiple turns), or less than one turn (less than 360 degrees revolution). For example, less than one turn can include a path extending along one side or a portion of one side on a multi-sided cross-section.

Furthermore, the chamber element 310 or the shaped insert element 330 or both can comprise an alignment feature configured to mate with a respective feature on either the chamber element 310 or the shaped insert element 330 in order to ensure precise alignment of the insert element 330 within chamber element 310.

Although one groove 332 is illustrated in FIGS. 9A through 9C, a plurality of grooves may be formed in the outer surface of the shaped insert element 330, each groove being independent of one another. Additionally, each groove in a plurality of grooves can be constructed to have a different outlet angle at the outlet end 336 of the insert member 330. Furthermore, each groove in a plurality of grooves can be constructed to have a different size, diameter or cross-sectional lateral dimension at the outlet end 336 or the inlet end 334 or at any location along the length of the helical path of the insert member 330. Further yet, each groove in a plurality of grooves can be constructed to have a different lateral dimension for the helix.

The diameter or cross-sectional lateral dimension of the groove 332 can range from approximately 5 microns to approximately 5 mm. Alternatively, the diameter or lateral dimension of the groove 332 can range from approximately 10 microns to approximately 3 mm. Alternatively yet, the diameter or lateral dimension of the groove 332 can range from approximately 50 microns to approximately 2 mm. For example, the diameter or lateral dimension can be approximately 50 microns or approximately 1 mm or approximately 2 mm.

According to another embodiment, insert element 330 may be formed within another insert element (which may be formed within another insert element, etc.). Insert element 330 may or may not be concentric with the other insert element. The other insert element, within which insert element 330 is formed, may also include one or more helical grooves formed on an outer surface thereof.

Although, in FIGS. 8A, 8B, 8C, 9A, 9B and 9C, the chamber element 210 (or 310) is illustrated with a single gas injection device 240 (340), the chamber element 210 (or 310) may comprise a plurality of gas injection devices. Additionally, the plurality of gas injection devices can be distributed in various density patterns on the chamber element. For example, more gas injection devices can be formed near the center of the chamber element and less gas injection devices can be formed near the periphery of the chamber element. Alternatively, for example, more gas injection devices can be formed near the periphery of the chamber element and less gas injection devices can be formed near the center of the chamber element. Additionally yet, the size of the groove or grooves can vary within a gas injection device or from one gas injection device to another gas injection device depending upon the position of the gas injection device on the chamber element. For example, larger grooves can be formed near the center of the chamber element and smaller grooves can be formed near the periphery of the chamber element. Alternatively, for example, smaller grooves can be formed near the periphery of the chamber element and larger grooves can be formed near the center of the chamber element.

Figure 10A:
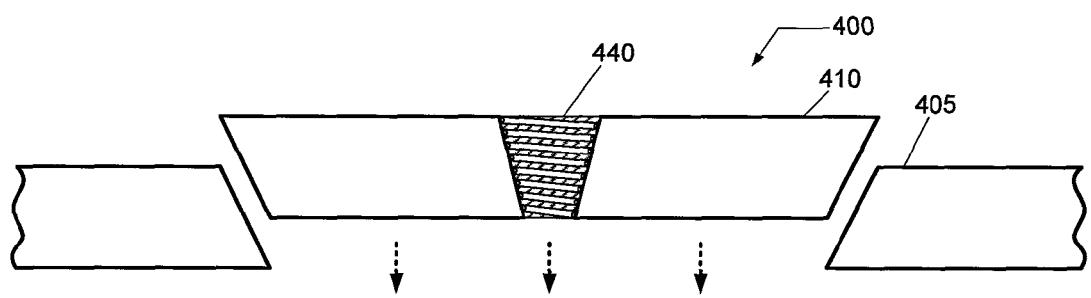
FIG. 10A illustrates a gas distribution opening according to another embodiment.

Referring now to FIG. 10A, a gas distribution system 400 is presented according to another embodiment. Gas distribution system 400 comprises an chamber element 410 having a gas injection device 440 adjoined to an opening formed there through that is configured to be coupled to a processing chamber component 405 and to receive a flow of a process gas from a process gas supply system and distribute the flow of the process gas within the processing chamber. The chamber element 410 may be an insertable and removable element within the processing chamber component 405.

Gas distribution system 400 comprises a shaped outer surface configured to mate with an inner surface of an opening formed in processing chamber component 405. If the chamber element 410 is an insertable and removable element, an operator can remove and replace chamber element 410 with greater ease and at reduced expense since the entire processing chamber component 405 will not require replacement.

Figure 10B:
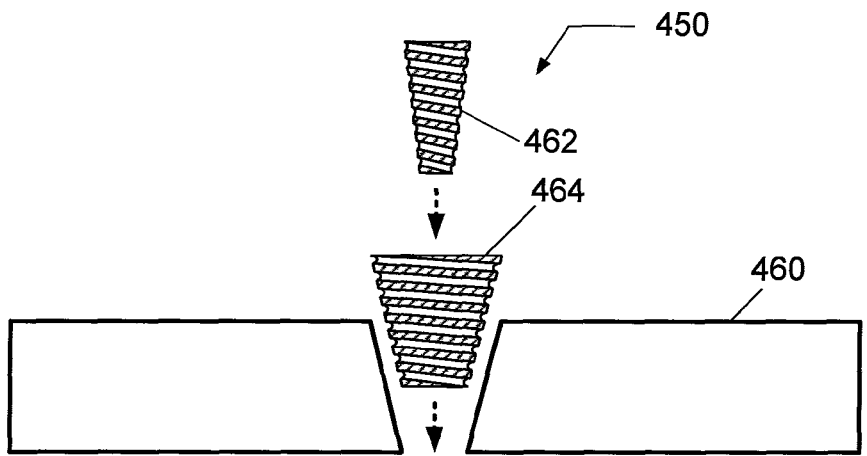
FIGS. 10B and 10C illustrate a gas distribution opening according to another embodiment.
Figure 10C:
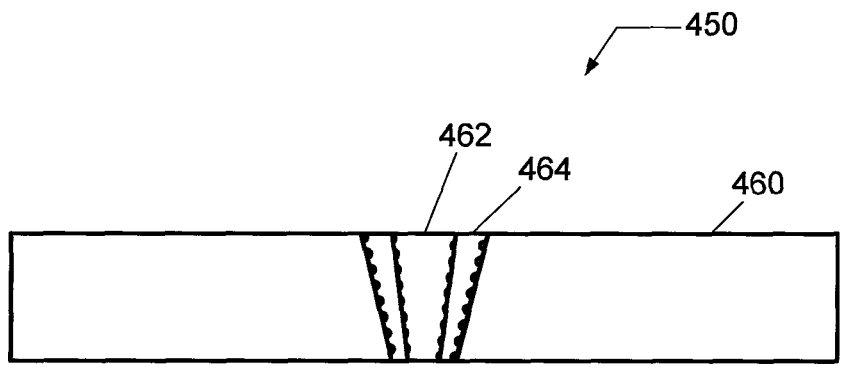

Referring now to FIGS. 10B and 10C, a gas distribution system 450 is presented according to another embodiment. Gas distribution system 450 comprises an chamber element 460 having a first gas injection device 462 formed within a second gas injection device 464 that is adjoined to an opening formed there through that is configured to be coupled to a processing chamber. The first gas injection device 462 and the second gas injection device 464 are configured to receive a flow of a process gas from a process gas supply system and distribute the flow of the process gas within the processing chamber. The first gas injection device 462 and the second gas injection device may be concentric or they may not be concentric.

Figure 11A:
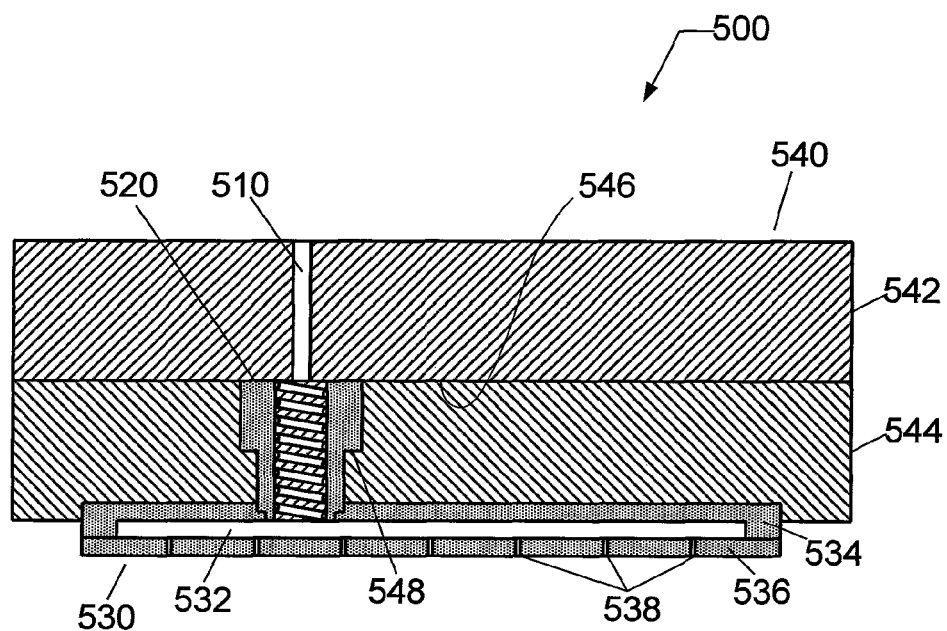
FIGS. 11A and 11B illustrate a gas distribution system according to another embodiment.
Figure 11B:
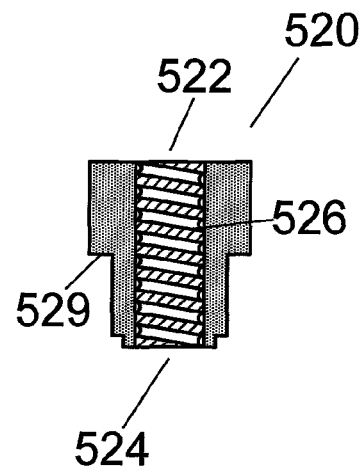

Referring now to FIGS. 11A and 11B, a gas distribution system 500 is presented according to one embodiment. The gas distribution system 500 is configured to be coupled to a processing chamber and to receive a flow of a process gas from a process gas supply system through a gas supply inlet 510 and distribute the flow of the process gas within a plenum 532 to a plurality of openings 538 in fluid communication with a process space in the processing chamber. Furthermore, the gas distribution system 500 comprises a gas injection device 520 located at the inlet 510 to the gas distribution system 500, wherein the gas injection device 520 may be configured to diffuse the momentum of the flow of the process gas into the plenum 532 such that the process gas is distributed to each of the plurality of openings 538 in such a way that the non-uniformity in plenum pressure is reduced. Additionally, the gas injection device 520 may be configured to prevent or reduce the probability of the occurrence of an electrical discharge of the flow of process gas through the gas injection device 520.

As shown in FIG. 11A, the gas distribution system 500 may comprise an upper assembly 540 configured to be coupled to the processing chamber. The upper assembly 540 may or may not comprise an electrode assembly. The upper assembly 540 may be coupled to electrical ground as in FIGS. 2, 3 and 5, or the upper assembly 540 may be coupled to electrical power as in FIGS. 4 and 6. The upper assembly 540 can include an electrode assembly having a first plate 542, through which gas supply inlet 510 is formed, and a second plate 544 coupled to the first plate 542, wherein the combination of the first and second plates are configured to retain the gas injection device 520 between a support shelf 548 formed in the second plate 544 and a surface 546 of the first plate 542. Vacuum sealing devices, such as elastomer O-rings, may be utilized to provide a vacuum seal between the first plate 542, the second plate 544 and the gas injection device 520. Alternatively, the upper assembly 540, including the gas injection device 520, can comprise a monolithic piece.

Additionally, the gas distribution system 500 comprises a gas injection system 530 coupled to the upper assembly 540 and configured to receive the flow of process gas from the gas injection device 520. The gas injection system 530 comprises a housing 534 and a gas distribution plate 536 coupled to the housing 534, wherein the gas distribution plate 536 comprises the plurality of openings 538 that facilitates a uniform flow of process gas from plenum 532 to the processing space in the processing chamber.

As illustrated in FIG. 11B, the gas injection device 520 comprises a lip 529 configured to be captured by the support shelf in the second plate 544, and further comprises a diffuser inlet 522 configured to be coupled with the gas supply inlet 510, a diffuser outlet 524 configured to be coupled with the plenum 532 in gas injection system 530, and a helical passage 526 extending from the diffuser inlet 522 to the diffuser outlet 524. The helical passage 526 may comprise a passage formed in a manner as described above.

The plurality of openings 538 in gas distribution plate 536 can range in number from 1 opening to approximately 1000 openings, and desirably they may range in number from approximately 10 openings to approximately 100 openings. The gas distribution plate 536 can be designed with the plurality of openings 538, each opening having a diameter ranging from approximately 0.5 mm to approximately 10 mm, and desirably ranging from approximately 0.5 mm to approximately 2 mm. Alternatively, the gas distribution plate 536 can be designed with the plurality of openings 538, each opening having a length ranging from approximately 1 mm to approximately 20 mm, and desirably ranging from approximately 1 mm to approximately 3 mm.

By utilizing the gas injection device 520, the variation of pressure within the plenum 532 can be reduced, particularly near the diffuser outlet 524, and the potential for a non-uniform flux of process gas through the plurality of openings 538 can be mitigated. Moreover, for example, process gas enters plenum 532 at an angle, thus, providing the process gas with a lateral velocity at the entry to plenum 532 and allowing the process gas to spread laterally through plenum 532. Additionally, the plenum height may be reduced and the conventional use of a baffle plate located within the plenum 532 between the inlet plane of the plenum 532 and the gas distribution plate 536 may be eliminated, thus allowing for reduction of the overall thickness of the gas injection system 530. The gas injection system 530 can be fabricated from a dielectric material. The plenum height may be designed to be less than approximately 5 mm, and desirably the plenum height can be designed to be less than approximately 3 mm.

The gas distribution system 500, including the upper assembly 540, the gas injection device 520 and the gas injection system 530, may be fabricated from a metal, such as aluminum or anodized aluminum, or a ceramic. Any one of these components may be fabricated from quartz, silicon, single crystal silicon, polycrystalline silicon, silicon nitride, silicon carbide, alumina, aluminum nitride, sapphire, carbon, glassy carbon, etc., or any combination of two or more thereof. Additionally, any one of these components, such as interior surfaces of these components, can be coated with a ceramic material, such as aluminum oxide or yttrium oxide. For example, any one of these components, such as interior surfaces of these components, may be coated with a material including $Al_2O_3$, $Sc_2O_3$, $Sc_2F_3$, $YF_3$, $La_2O_3$, $Y_2O_3$, or $Dy_2O_3$. Alternatively these surfaces may be coated with a column III element.

In one example, the upper assembly 540 is fabricated from aluminum with or without surface anodization. The upper assembly 540 can serve as an electrode assembly and it can be coupled to an electrical power source, such as a radio frequency (RF) power source. The gas injection system 530 can be fabricated from a dielectric material, such as quartz, in order to permit the coupling of RF power from the upper assembly 540 through the gas injection system 530 to the process gas in the processing space. Additionally, the gas injection device 520 can be fabricated from a dielectric material, such as quartz. When the process gas contains a corrosive gas, such as HBr, $Cl_2$, $NF_3$, etc., the gas injection device 520 and the gas injection system 530 can be fabricated from quartz in order to minimize contamination of the substrate in the processing chamber.

Figure 12:
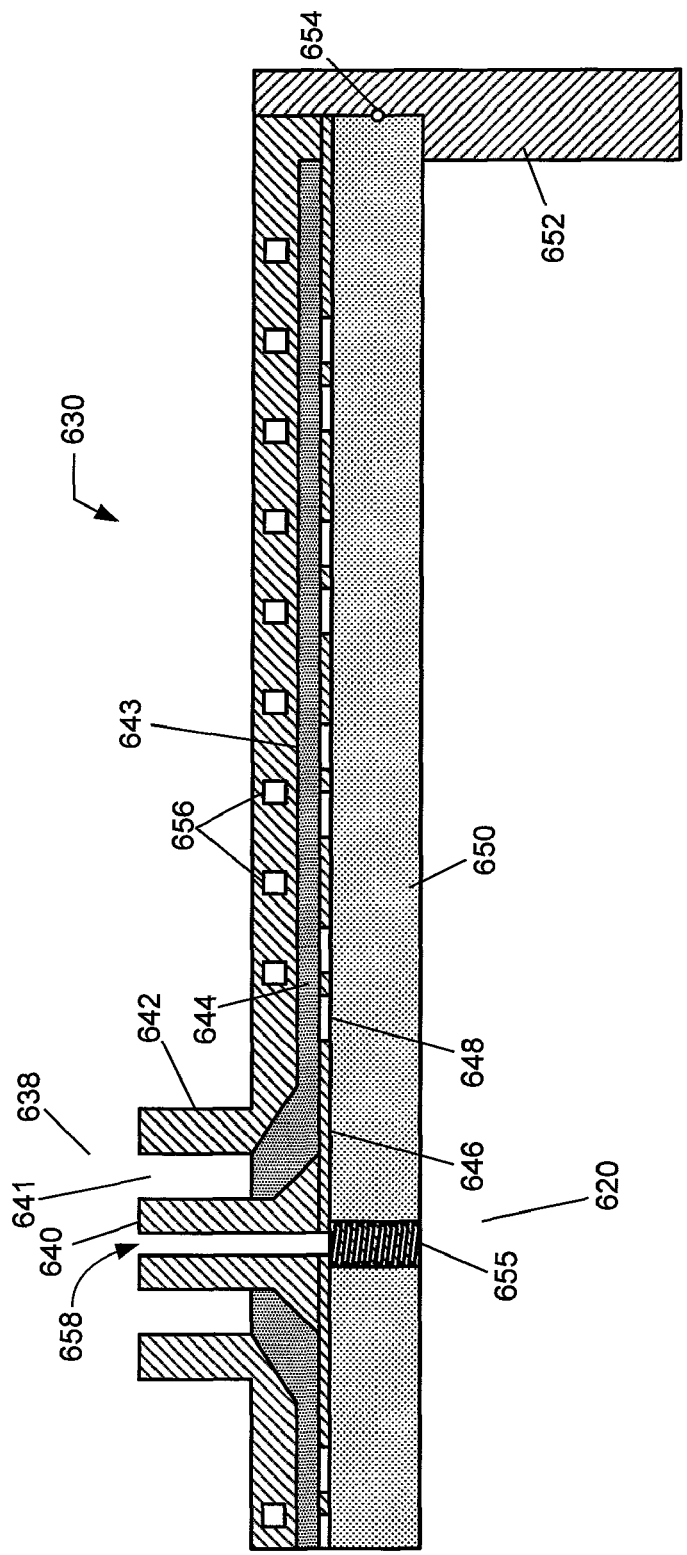
FIG. 12 illustrates a gas distribution system according to another embodiment.

Referring now to FIG. 12, a gas distribution system 620 formed in a surface wave plasma (SWP) source 630 is presented according to another embodiment. The SWP source 630 is configured to be coupled to a processing chamber and the gas distribution system 620 is configured to receive a flow of a process gas from a process gas supply system and distribute the flow of the process gas within a process space in the processing chamber. As illustrated in FIG. 12, plasma source 630 can comprise a slot antenna, such as a radial line slot antenna (RLSA).

The slot antenna comprises a coaxial feed 638 having an inner conductor 640, an outer conductor 642, and insulation 641. Additionally, the plasma source 630 includes an electromagnetic (EM) wave launcher 643 comprising a slow wave plate 644, a slot antenna 646 having slots 648, and a resonator plate 650. The number of slots, geometry of the slots, the size of the slots, and the distribution of the slots are all factors that can contribute to the spatial uniformity of the plasma formed in the processing chamber. For instance, the exact dimensions of the resonator plate 650 (i.e., thickness, and diameter) can be calculated numerically.

The wave launcher 643 includes a microwave launcher configured to radiate microwave power into the processing chamber. The microwave launcher can be coupled to a microwave source, such as a 2.45 GHz microwave power source, wherein microwave power is coupled to the microwave launcher via the coaxial feed 638. Microwave energy generated by the microwave source is guided through a waveguide (not shown) to an isolator (not shown) for absorbing microwave energy reflected back to the microwave oscillator, and thereafter it is converted to a coaxial TEM mode via a coaxial converter (not shown). A tuner may be employed for impedance matching, and improved power transfer. The microwave energy is coupled to the microwave launcher via the coaxial feed 638, where another mode change occurs from the TEM mode in the coaxial feed 638 to a TM mode.

Referring still to FIG. 12, the plasma source 630 is coupled to the processing chamber, wherein a vacuum seal can be formed between a chamber wall 652 and the plasma source 630 using a sealing device 654. The sealing device 654 can include an elastomer O-ring. The plasma source 630 may include one or more cooling channels 656 for adjusting and/or controlling the temperature of the plasma source 630.

The inner conductor 640 and the outer conductor 642 of the coaxial feed 638 comprise a conductive material, such as a metal, while the slow wave plate 644 and the resonator plate 650 comprise a dielectric material. In the latter, the slow wave plate 644 and the resonator plate 650 comprise the same material. Alternatively, the slow wave plate 644 and the resonator plate 650 comprise different materials. The dielectric material can, for example, include quartz.

The material selected for fabrication of the slow wave plate 644 and the resonator plate 650 is chosen to reduce the wavelength of the propagating electro-magnetic (EM) wave relative to the free-space wavelength, and the dimensions of the slow wave plate 644 and the resonator plate 650 are chosen to ensure the formation of a standing wave effective for radiating EM energy into the processing chamber.

Referring still to FIG. 12, the gas distribution system 620 comprises an inlet 658 formed through inner conductor 640 and a gas injection device 655 formed through resonator plate 650. The gas injection device 655 comprises an inlet end configured to be coupled to inlet 658 and receive a flow of process gas there through. The gas injection device 655 may be fabricated in the resonator plate 650 using any one of the techniques described above.

As illustrated in FIG. 12, a single gas injection device 650 may be utilized. However, alternatively, a plurality of gas injection devices can be formed in resonator plate 650. Additionally, the plurality of gas injection devices can be distributed in various density patterns on the resonator plate 650. The gas injection device 650 can include a single groove following a helical path as shown in FIG. 12, or the gas injection device 650 can include a plurality of grooves following a helical path. Each groove in a plurality of grooves can include a different outlet angle. For example, a single gas injection device 650, as shown in FIG. 12, having a plurality of grooves with different outlet angles can be utilized to distribute process gas throughout the processing chamber.

Figure 13:
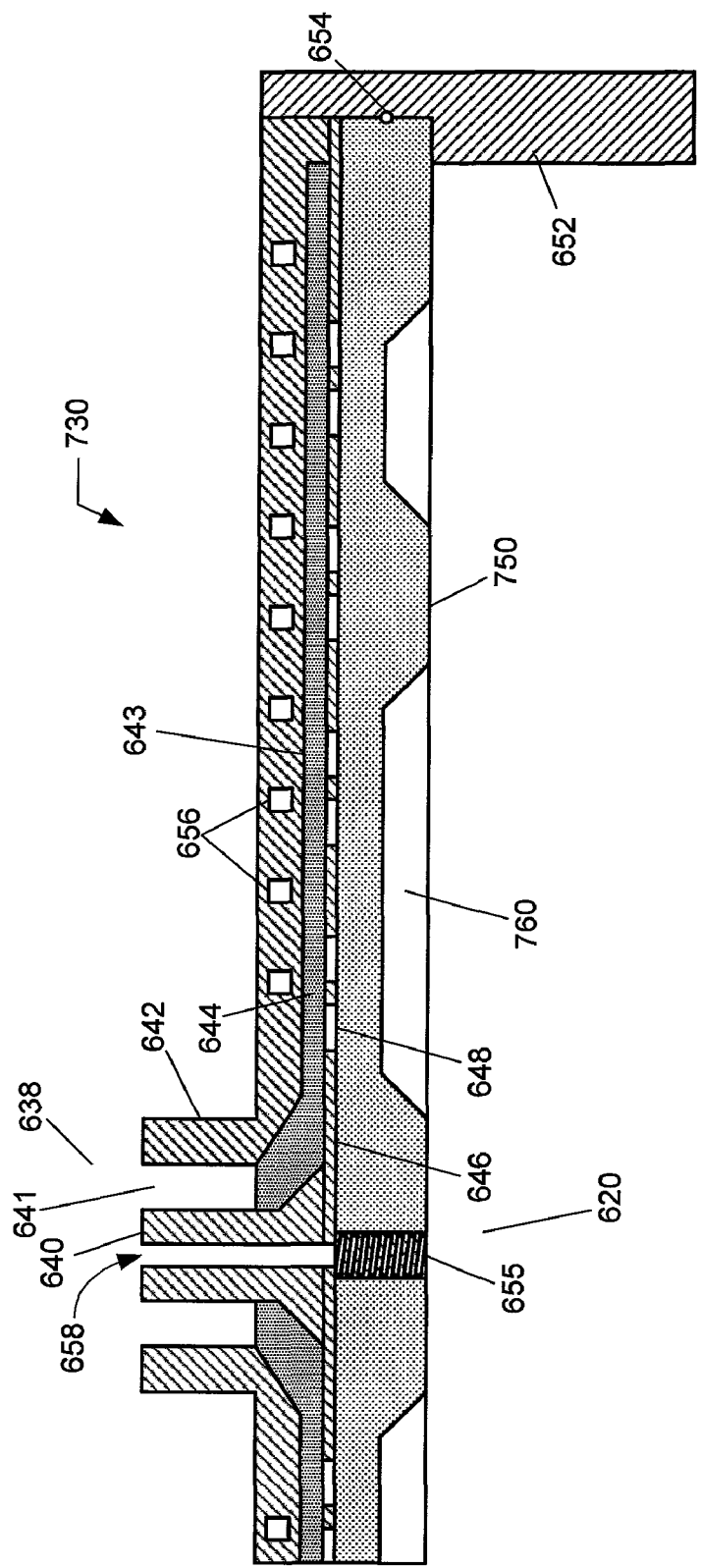
FIG. 13 illustrates a gas distribution system according to yet another embodiment.

Referring now to FIG. 13, a surface wave plasma (SWP) source 730 is presented according to yet another embodiment. The SWP source 730 can be similar to the embodiment of FIG. 12, wherein like reference numerals designate corresponding parts. The SWP source 730 is configured to be coupled to a processing chamber and the gas distribution system 620 is configured to receive a flow of a process gas from a process gas supply system and distribute the flow of the process gas within a process space in the processing chamber. As illustrated in FIG. 13, plasma source 730 can comprise a slot antenna, such as a radial line slot antenna (RLSA).

As illustrated in FIG. 13, SWP source 730 comprises a shaped resonator plate 750 having a contoured surface 760. For example, the contoured surface 760 can be tailored to improve the spatial uniformity of plasma in the processing chamber.

Figure 14:
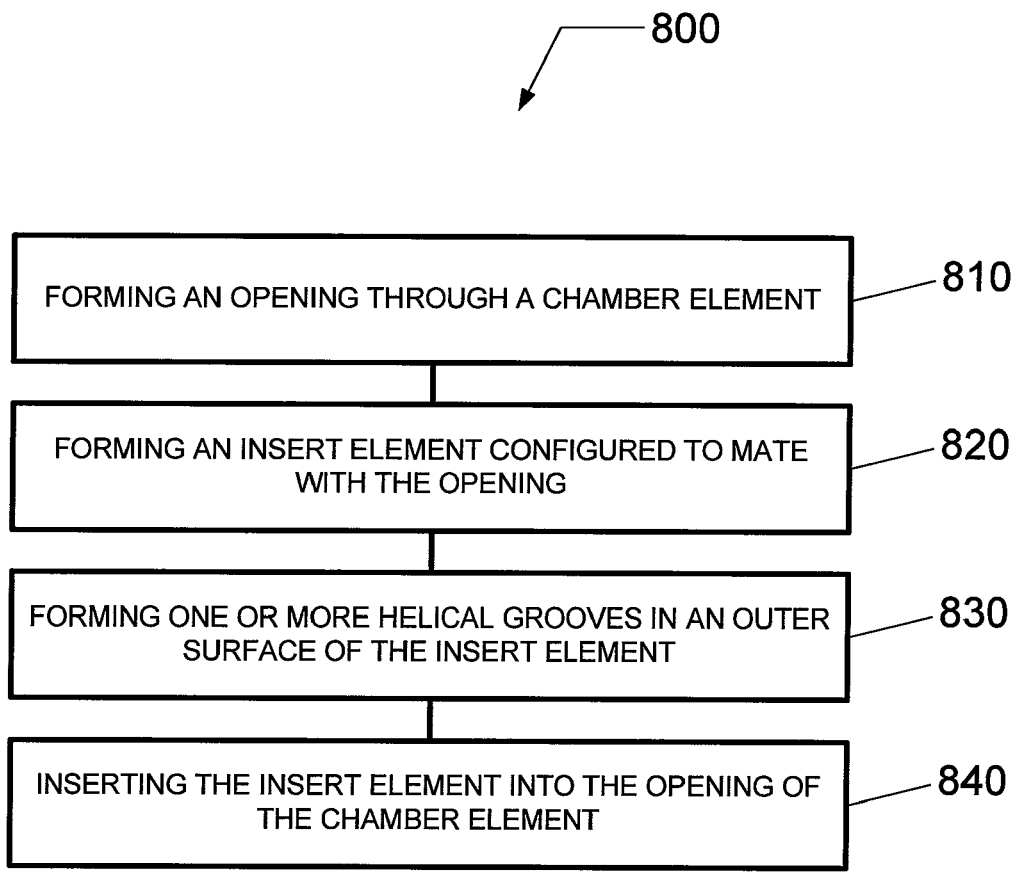
FIG. 14 illustrates a method of fabricating a gas distribution opening according to another embodiment.

Referring now to FIG. 14, a method of fabricating a helical conduit through a chamber element is provided. The method comprises a flow chart 800 beginning in 810 with forming an opening through the chamber element extending from a supply side on the chamber element to a process side on the chamber element, wherein the opening has an inner surface. The chamber element can include any of the components described in FIGS. 1 through 13.

In 820, an insert element having an outer surface configured to mate with the inner surface of the opening is formed.

In 830, one or more grooves are formed in the outer surface of the insert element. The one or more grooves are formed such that each of the one or more grooves comprises an inlet formed at a supply side of the chamber element and an outlet formed at a process side of the chamber element. The one or more grooves may comprise one or more helical grooves.

In 840, the insert element is inserted into the opening of the chamber element.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A chamber component configured to be coupled to a processing chamber, comprising:
   a chamber element comprising a first surface on a supply side of said chamber element and a second surface on a process side of said chamber element, said process side opposing said supply side, wherein said chamber element comprises an opening having an interior surface that is formed through said chamber element from said first surface to said second surface, and wherein said interior surface is a conical surface or a right circular cylindrical surface;
   an insert member insertable within said opening such that, when inserted within said opening, said insert member extends through and occupies said opening from said first surface of said chamber element to said second surface of said chamber element, said insert member comprising a groove formed in an outer surface of said insert member that extends along a helical path from an inlet at said supply side of said chamber element to an outlet at said process side of said chamber element; and
   a second insert member insertable within a second opening having a second interior surface that is formed through said insert member from a top surface of said insert member to a bottom surface of said insert member, wherein, when inserted within said second opening, said second insert member extends through and occupies said second opening from said top surface to said bottom surface, said second insert member comprising a second groove formed in a second outer surface of said second insert member that extends along a second helical path from a second inlet at said supply side of said chamber element to a second outlet at said process side of said chamber element,
   wherein the portion of said outer surface remaining after forming said groove in said outer surface contacts and mates with said interior surface of said opening in said chamber element when said insert member is inserted within said opening of said chamber element,
   wherein, when said insert member is inserted within said opening of said chamber element, a helical conduit extending through said chamber element from said supply side to said process side is formed by said interior surface of said opening and said groove in said outer surface of said insert element, said helical conduit configured to receive a process fluid at said inlet and to distribute said process fluid at said outlet within a processing system for treating a substrate,
   wherein the portion of said second outer surface remaining after forming said second groove in said second outer surface contacts and mates with said second interior surface of said second opening in said insert member when said second insert member is inserted within said second opening of said insert member, and
   wherein, when said second insert member is inserted within said second opening of said insert member, a second helical conduit extending through said insert member from said supply side to said process side is formed by said second interior surface of said second opening and said second groove in said second outer surface of said second insert element, said second helical conduit configured to receive said process fluid at said second inlet and to distribute said process fluid at said second outlet within said processing system for treating said substrate.

2. The chamber component of claim 1, wherein said helical conduit is configured to transport a process fluid comprising a gas, a liquid, a solid powder, a solid suspended in a gas, a solid suspended in a liquid, or a gas suspended in a liquid, or a combination of two or more thereof.

3. The chamber component of claim 1, wherein said helical conduit completes substantially one turn about an axis extending from said supply side to said process side, or said helical conduit completes more than one turn about an axis extending from said supply side to said process side, or said helical conduit completes less than one turn about an axis extending from said supply side to said process side, or said helical conduit completes multiple turns about an axis extending from said supply side to said process side.

4. The chamber component of claim 1, wherein a plurality of helical conduits are extending through said chamber element from said supply side to said process side, each of said plurality of helical conduits comprising an inlet configured to receive a process fluid and an outlet configured to distribute said process fluid.

5. The chamber component of claim 4, wherein each of said plurality of helical conduits comprise a different outlet angle, or each of said plurality of helical conduits comprise the same outlet angle.

6. The chamber component of claim 4, wherein each of said plurality of helical conduits comprise a different lateral dimension for the helix.

7. The chamber component of claim 1, wherein said chamber element comprises a dielectric member formed on or within a powered radio frequency (RF) electrode, or said chamber element comprises a resonator plate on a slotted plane antenna.

8. The chamber component of claim 1, wherein said insert element is press fit or thermally fit within said opening.

9. The chamber component of claim 1, wherein said insert element is adjoined by said chamber element via a fuse joint, a braze joint, or a weld joint.

10. The chamber component of claim 1, wherein said second insert member is concentric with said insert member.

11. A treatment system, comprising:
   a process chamber, including a process space;
   a process gas supply system in fluid communication with said process chamber and configured to introduce a flow of a process gas to said process chamber;
   a gas distribution system coupled to said process chamber and configured to receive said flow of said process gas through an inlet and distribute said flow of said process gas in said process space, wherein said gas distribution system comprises a gas injection device coupled to said inlet and wherein said gas injection device comprises:

a chamber element comprising a first surface on a supply side of said chamber element and a second surface on a process side of said chamber element, said process side opposing said supply side, wherein said chamber element comprises an opening having an interior surface that is formed through said chamber element from said first surface to said second surface, and wherein said interior surface is a conical surface or a right circular cylindrical surface, an insert member inserted within said opening such that said insert member extends through and occupies said opening from said first surface of said chamber element to said second surface of said chamber element, said insert member comprising a groove formed in an outer surface of said insert member that extends in a helical path from an inlet end at said supply side of said chamber element to an outlet end at said process side of said chamber element, and a second insert member insertable within a second opening having a second interior surface that is formed through said insert member from a top surface of said insert member to a bottom surface of said insert member, wherein, when inserted within said second opening, said second insert member extends through and occupies said second opening from said top surface to said bottom surface, said second insert member comprising a second groove formed in a second outer surface of said second insert member that extends along a second helical path from a second inlet at said supply side of said chamber element to a second outlet at said process side of said chamber element, wherein the portion of said outer surface remaining after forming said groove in said outer surface contacts and mates with said interior surface of said opening in said chamber element when said insert member is inserted within said opening of said chamber element, wherein, when said insert member is inserted within said opening of said chamber element, a helical conduit extending through said chamber element from said supply side to said process side is formed by said interior surface of said opening and said groove in said outer surface of said insert element, said helical conduit configured to receive a process fluid at said inlet end and to distribute said process fluid at said outlet end, wherein the portion of said second outer surface remaining after forming said second groove in said second outer surface contacts and mates with said second interior surface of said second opening in said insert member when said second insert member is inserted within said second opening of said insert member, and wherein, when said second insert member is inserted within said second opening of said insert member, a second helical conduit extending through said insert member from said supply side to said process side is formed by said second interior surface of said second opening and said second groove in said second outer surface of said second insert element, said second helical conduit configured to receive said process fluid at said second inlet and to distribute said process fluid at said second outlet within said processing system for treating said substrate;

a holder coupled to said process chamber and configured to support a substrate in said process chamber for exposure to said process gas; and a vacuum pumping system coupled to said process chamber and configured to evacuate said process chamber.

12. The treatment system of claim 11, wherein said gas distribution system is configured to receive said flow of said process gas through said inlet and distribute said flow of said process gas within a plenum to a plurality of said helical conduits extending through said gas injection device and in fluid communication with said process space.

13. The treatment system of claim 11, further comprising:
a plasma generation system coupled to said process chamber and configured to form plasma from said process gas in said process space, wherein said gas distribution system is formed on or within said plasma generation system.

14. The treatment system of claim 11, further comprising:
a plasma generation system coupled to said process chamber and configured to form plasma from said process gas in said process space, wherein said plasma generation system is a surface wave plasma (SWP) source comprising:
a power coupling system, and
an electro-magnetic (EM) wave launcher coupled to said power coupling system and configured to radiate EM energy from said power coupling system to said process space, said EM launcher comprising a slotted plane antenna having a resonator plate,
wherein said inlet is formed in said slotted plane antenna, and
wherein said gas injection device is formed through said resonator plate.

15. The treatment system of claim 14, wherein said power coupling system includes a microwave power coupling system, and wherein said microwave power coupling system includes a microwave source configured for producing microwave energy at 2.45 GHz, a waveguide coupled to an outlet of said microwave source, an isolator coupled to said waveguide and configured to prevent propagation of microwave energy back to said microwave source, a coaxial converter coupled to said isolator and configured to couple said microwave energy to a coaxial feed, wherein said coaxial feed is further coupled to said EM wave launcher.

16. The treatment system of claim 14, wherein said power coupling system comprises a coaxial feed for coupling EM energy to said EM wave launcher, said slotted plane antenna comprises one end coupled to an inner conductor of said coaxial feed and another end coupled to an outer conductor of said coaxial feed, wherein said slotted plane antenna includes one or more slots configured to couple said EM energy from a first region above said slotted plane antenna between said inner conductor and said outer conductor to said resonator plate in a second region below said slotted plane antenna.

17. The treatment system of claim 16, wherein said inlet is formed through said inner conductor.

* * * * *